United States Patent [19]

Nulman

[11] Patent Number: 5,443,995
[45] Date of Patent: Aug. 22, 1995

[54] METHOD FOR METALLIZING A SEMICONDUCTOR WAFER

[75] Inventor: Jaim Nulman, Palo Alto, Calif.

[73] Assignee: Applied Materials, Inc., Santa Clara, Calif.

[21] Appl. No.: 122,851

[22] Filed: Sep. 17, 1993

[51] Int. Cl.⁶ .................. H01L 21/44; H01L 21/48
[52] U.S. Cl. .................. 437/197; 437/192; 437/194
[58] Field of Search ............ 437/197, 195, 192, 189, 437/194, 190

[56] References Cited

U.S. PATENT DOCUMENTS

| | | | |
|---|---|---|---|
| 4,999,160 | 3/1991 | Lowrey et al. | 437/197 |
| 5,081,064 | 1/1992 | Inoue et al. | 437/189 |
| 5,202,008 | 4/1993 | Talieh et al. | 204/192.32 |
| 5,229,325 | 7/1993 | Park et al. | 437/187 |
| 5,238,874 | 8/1993 | Yamada | 437/189 |

FOREIGN PATENT DOCUMENTS

| | | | |
|---|---|---|---|
| 4-324636 | 11/1992 | Japan | 437/197 |
| 5-55203 | 3/1993 | Japan | 437/197 |

OTHER PUBLICATIONS

Wolf et al. vol. 1, Silicon processing for VLSI Era. pp. 359–365, 391–392, 1986.
Wolf vol. 2, Silicon processing for VLSI Era pp. 245–255, 279–286., 1990.

*Primary Examiner*—Olik Chaudhuri
*Assistant Examiner*—H. Jey Tsai
*Attorney, Agent, or Firm*—Thomas B. Haverstock

[57] ABSTRACT

A method for metallizing semiconductor materials includes two processing steps. In the first step, a layer of an alloy of conductive metal, such as aluminum, and refractory metal, such as titanium, tungsten or silicon, is deposited on the surface in a single step from a single source. In the second step, a layer of the conductive metal is deposited over the alloy layer. Thus, using this method, metallization can be conveniently performed using two chambers.

18 Claims, 3 Drawing Sheets

METHOD FOR METALLIZING A SEMICONDUCTOR WAFER

TECHNICAL FIELD OF THE INVENTION

This invention relates generally to semiconductor processes for forming integrated circuits, and more particularly to an improved process for providing conductive pathways on semiconductor integrated circuits by sequentially depositing at least two metal layers.

BACKGROUND OF THE INVENTION

Integrated circuits are usually produced from large wafers of semiconductor material such as, for example, silicon or gallium arsenide, from which a plurality of chips can be simultaneously produced. The dimensions of the individual chips are delineated by scoring or grooving the wafer in checkerboard fashion. Each chip is provided with a circuit pattern by using standard masking and photolithographic methods to form an integrated circuit. Contact-holes are also provided for connecting between different conductive layers on a circuit.

The conductive film or metallization typically serves to electrically connect together the devices of an integrated circuit, to connect one integrated circuit to another, to allow access from outside the circuit and to form electrodes for devices. The metal most commonly used for metallization is aluminum. The aluminum can be deposited on the semiconductor wafer using any one of a variety of conventional deposition techniques, such as, for example, sputtering or evaporation.

Conventional metallization involves several steps preparatory to actually depositing the aluminum layer. A barrier layer can be deposited first after a contact opening is formed, if desired, to prevent the aluminum from dissolving silicon from the substrate layer, a problem referred to as "spiking."

FIGS. 1A through 1F, show a common process for forming a multi-layer metal interconnect structure. A conducting layer 100 of doped silicon or other material is provided and covered with an insulating layer 102, such as $SiO_2$ or $Si_3N_4$ as shown in FIG. 1A. A contact hole 104 is formed through the insulating layer 102 using conventional photolithographic techniques to expose a portion of the conducting layer 100.

FIG. 1B shows a barrier layer 106 formed over the surface of the structure of FIG. 1A. A barrier layer 106 is provided when the potential for aluminum spiking can cause a failure. Typically, the barrier layer 106 is deposited onto the bottom of the contact opening. The barrier layer 106 is typically a compound of titanium-tungsten or titanium nitride and is very thin, on the order of 50–200 Å at the bottom. The barrier layer processing step shown in FIG. 1B is optional and its use depends upon the materials being used.

The next conventional step includes forming an adhesion layer 108 of a refractory metal, typically, titanium. Other materials include tungsten and silicon. The adhesion layer provides for good adhesion of a subsequently deposited aluminum layer to the surface of the semiconductor wafer, including any dielectric materials which may have been deposited. This layer is typically 20 to 500 Å thick at the bottom of opening 104.

Next, a layer of aluminum 110 is formed, typically by sputter deposition at a temperature between room temperature and 200° C. as shown in FIG. 1D. The aluminum layer can be formed of an aluminum alloy such as 1% silicon and/or 0.5% copper. Unfortunately, the deposition steps required for FIGS. 1C and 1D require separate deposition chambers to avoid contamination, the necessity of changing the target and other related deleterious factors. Such methods have dedicated deposition chambers for each layer. These chambers are mounted to a central vacuum transfer chamber, so that the layers are not exposed to any ambient, other than vacuum, typically in the range of IE-9 to IE-7 Torr, during transfer from one chamber to the next.

As shown in FIG. 1D, the step coverage of the aluminum or aluminum alloy layer can be poor. To improve the step coverage, heat is applied in the step of FIG. 1E in excess of 300° C. and typically in the temperature range of 400° to 600° C. This anneal step may be performed in the deposition chamber or in a separate anneal chamber. This causes the aluminum layer 110' to flow and form an alloy layer 108' of the material deposited as the adhesion layer 108 and the aluminum 110 as shown in FIG. 1E. During this heating step, a limited portion of the aluminum combines with the refractory metal to form an aluminum/refractory alloy 108'.

Lastly, additional aluminum is deposited in a third deposition step which combines with the reflowed aluminum layer 110' to form a thicker aluminum layer 110" and thereby reduce the electrical impedance of this metal layer as shown in FIG. 1F.

An alternative process sequence has been the deposition of a thin aluminum layer 110, typically 500 to 4000 angstroms, At temperatures less than 300° C. as in FIG. 1D, followed by deposition of a hot aluminum layer 111 at temperatures between 400° and 600° C., FIG. 1E, during this hot step, part of layer 110 combines with layer 108 (FIG. 1D) to form a composite alloy layer 108' (FIG. 1E). This allows for the hot aluminum layer 112 to flow into the opening 104. The hot aluminum deposition can be continued until a fully planarized surface is obtained, FIG. 1F.

These processes are time consuming, and require the use of at least three different deposition chambers in order to complete a single metallization. (Four deposition chambers are needed if a barrier layer is included in the process.) Accordingly, the need exists for a process which reduces the time and equipment required to produce metallization on a semiconductor wafer.

SUMMARY OF THE INVENTION

The present invention provides a method for simultaneously metallizing the surface of semiconductor material, such as a semiconductor wafer, and filling contact-holes in the surface of the semiconductor material in two steps: first, by depositing in a single step and from a single source a layer of an alloy formed from a conductive aluminum metal and a refractory metal; and, second, by depositing a layer of conductive aluminum metal over the layer of alloy. This process may also include first forming a barrier layer.

BRIEF DESCRIPTION OF THE DRAWINGS

A better understanding of the invention and its advantages will be apparent from the detailed description taken in conjunction with the accompanying drawings in which.

DETAILED DESCRIPTION OF THE INVENTION

Figure 2A:
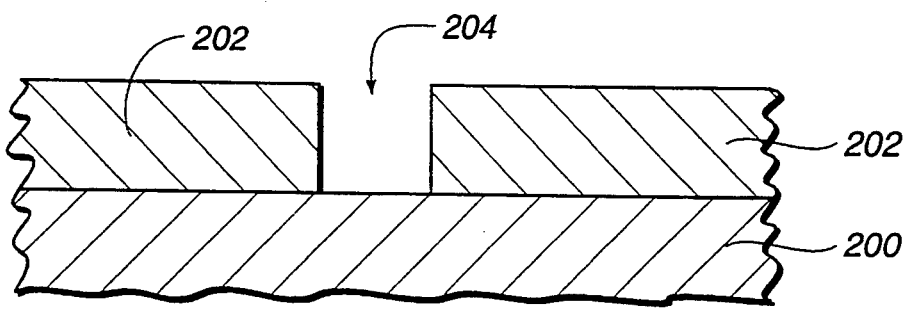
FIGS. 2A through 2F show cross-sectional views of a portion of a semiconductor wafer, taken during the several relevant steps for forming a metallization layer according to the present invention.

As shown in FIG. 2A, during the production of integrated circuits, a semiconductor wafer typically includes a conductive layer 200 which is covered with an insulating dielectric layer 202. The insulating layer 202 may be formed of multiple layers depending upon the requirements of the circuit and processing technology. The insulating layer 202 is provided with contact-holes 204 which can extend completely through the insulating layer 202 to expose a portion of the conductive layer 200.

Figure 2B:
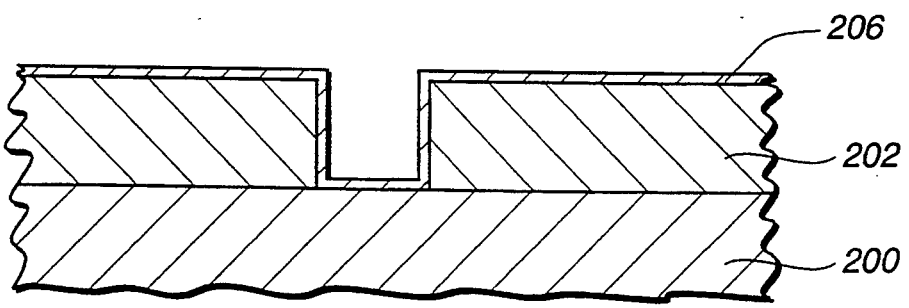

As shown in FIG. 2B, when it is desired to form a layer of conductive metal, and fill the contact-holes with the conductive metal, one can begin by depositing a conventional barrier layer 206, if such a layer is desired or needed. This barrier layer 206 can be any suitable material such as, for example, titanium-tungsten or titanium nitride. The barrier layer 206 is optional under the process of the present invention, but may be desirable where spiking might be a problem.

Figure 2C:
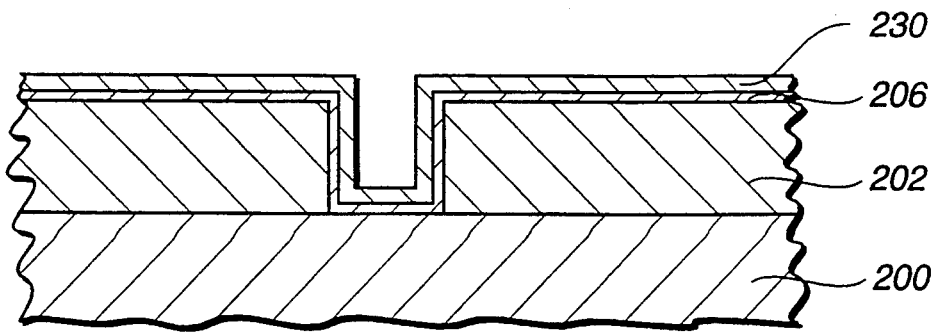

As shown in FIG. 2C, a first layer of metal alloy 230 including an adhesion metal and conductive aluminum or aluminum alloy metal is formed of a composite of an alloy of a refractory metal and a conductive aluminum or aluminum alloy metal. According to the present invention, the composite alloy is formed by simultaneously depositing both the conductive aluminum or aluminum alloy metal and the refractory metal in the same deposition chamber. To achieve this, for example, the alloy is preferably sputter deposited using a target which is formed of both the materials to be deposited. The conductive metal can be selected from any of those known to be useful as such in semiconductor processing, and is preferably aluminum or an aluminum alloy having 1% silicon or 0.5% copper. The refractory metal can be selected from any of those known to be useful in semiconductor processing, preferably from the group including titanium, tungsten or titanium nitride or a silicon, and most preferably is titanium.

Figure 1A:
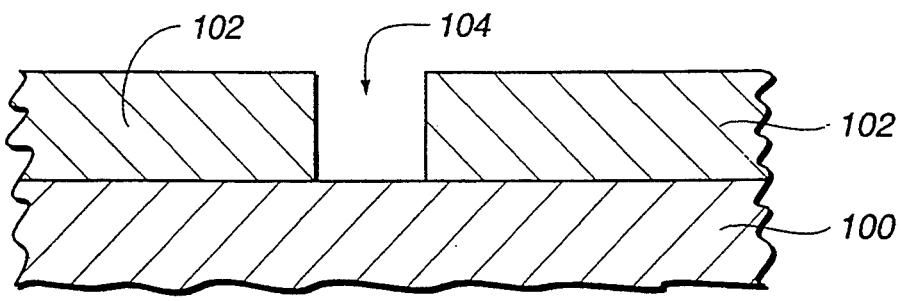
FIGS. 1A through 1F show cross-sectional views of a portion of a semiconductor wafer, taken during the several relevant steps for forming a metallization layer in the prior art.
Figure 1B:
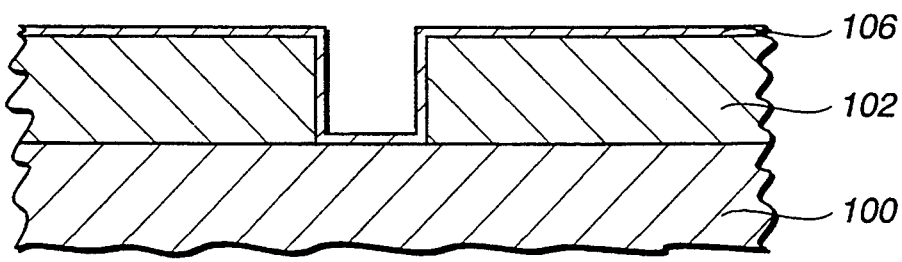
Figure 1C:
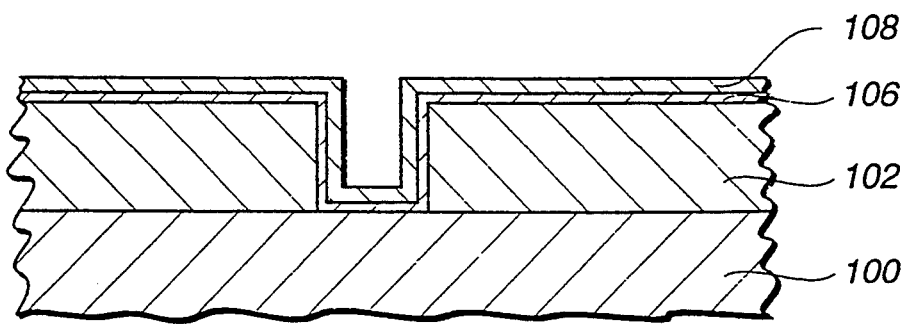
Figure 1D:
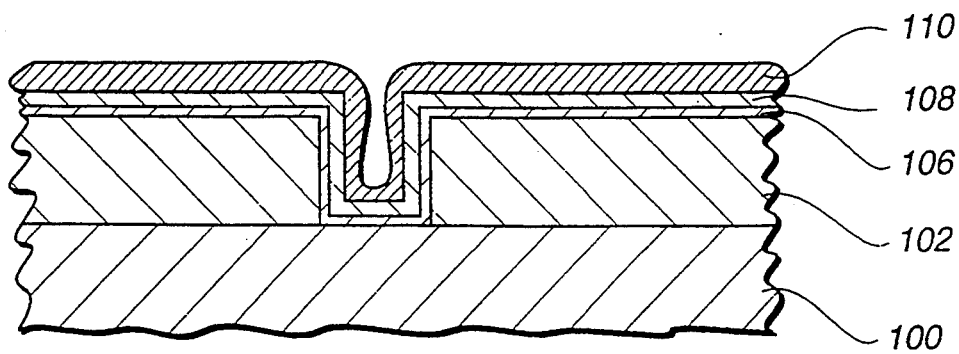
Figure 1E:
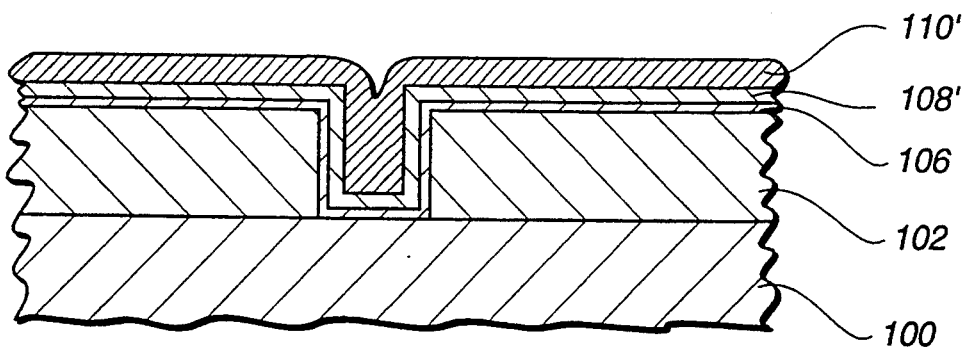
Figure 1F:
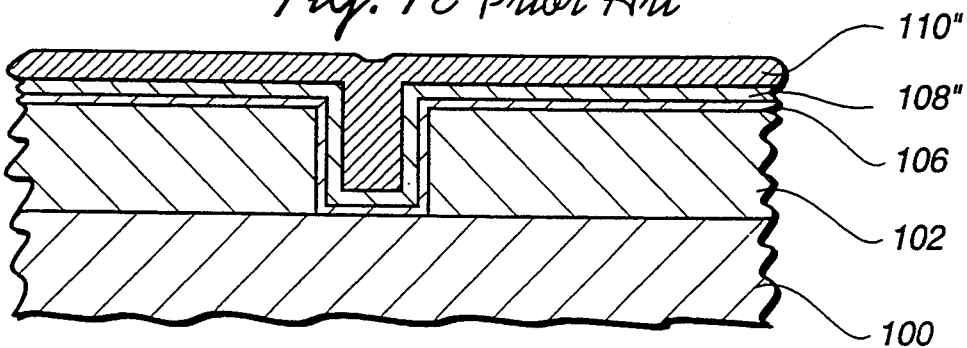

The ratio of the conductive metal to the refractory metal in the alloy is adjusted by appropriately forming the target from the proper ratio of desired materials. The ratio can be selected to closely approximate the desired final alloy, such as that found in the layer 108' or 108" of the prior art of FIGS. 1E and 1F. However, the ratio can be any up to the solid solubility of the refractory metal in the aluminum or aluminum alloy.

Figure 2D:
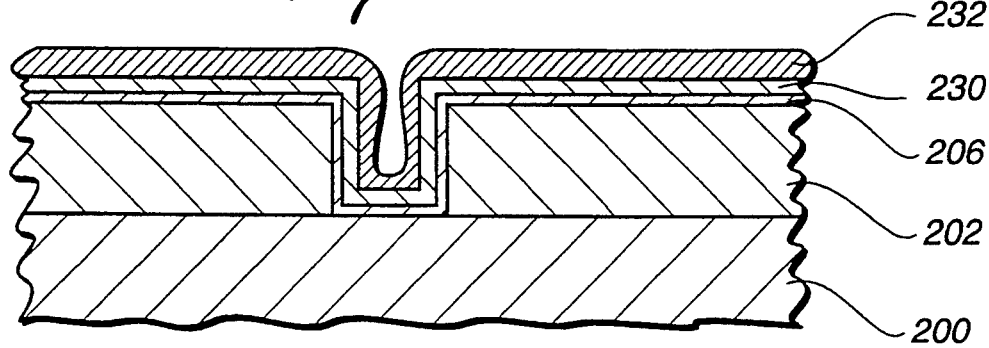

The metallization is completed, as shown in FIG. 2D, by depositing a layer of conductive aluminum or aluminum alloy metal 232 over the alloy layer 230. The structure illustrated in FIG. 2D is obtained by placing the semiconductor wafer in a second chamber, and depositing the conductive aluminum or aluminum alloy metal, preferably by sputtering. This can be done at a low temperature in the range between room temperature to less than about 200 degrees centigrade as shown in FIG. 2D. Once the conductive aluminum or aluminum alloy metal layer 232 is deposited at this low temperature, the wafer is next subjected to a heating step which brings the wafer to a temperature greater than 200 degrees centigrade and preferably in the range between about 400 degrees centigrade and 600 degrees centigrade, to substantially eliminate voids in the contact-holes and to provide enhanced step coverage as shown in FIG. 2E by allowing the aluminum to flow into the opening 204.

Figure 2E:
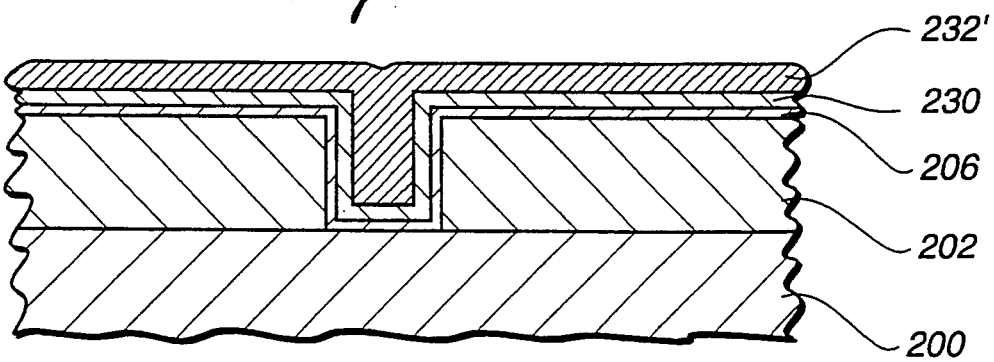
Figure 2F:
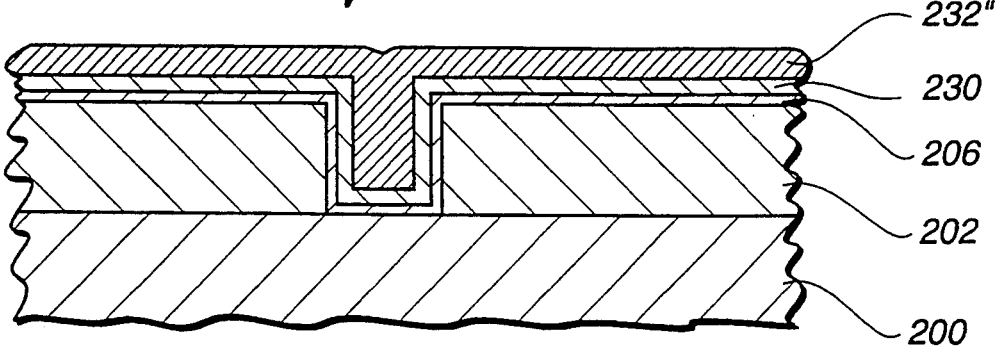

Alternatively, the steps shown in FIGS. 2D and 2E can be replaced by a "hot" deposition step as shown in FIG. 2F. During this "hot" deposition step, the conductive aluminum or aluminum alloy metal layer 232" is deposited in a chamber wherein the wafer is raised to a temperature that is greater than 200 degrees centigrade, and preferably in the range between about 400 degrees centigrade and 600 degrees centigrade before depositing the conductive metal. The conductive metal can be deposited entirely at the desired temperature, or can be deposited while ramping up the temperature.

While the preferred embodiments have been described in detail, and shown in the accompanying drawings, it will be evident that various further modification are possible without departing from the scope of the invention as set forth in the appended claims.

What is claimed is:

1. A method of simultaneously metallizing the surface of a semiconductor wafer and filling contact-holes, comprising the steps in the order listed of:
   providing a semiconductor wafer;
   forming an insulating layer over the semiconductor wafer;
   forming a contact-hole through the insulating layer;
   depositing a layer of alloy including aluminum and a refractory metal, the layer of alloy being deposited in a single step from a single target formed of both the aluminum and the refractory metal, the deposition being continued for a time period such that only a portion of the contact-hole is filled with the layer of alloy; and
   depositing a layer of aluminum over the layer of alloy including the layer of alloy present in the hole substantially filling the contact-hole thereby.

2. The method of claim 1 wherein the aluminum is an aluminum alloy.

3. The method of claim 1 wherein the refractory metal is selected from the group consisting of titanium, tungsten, a composite thereof, and titanium nitride.

4. The method of claim 1 wherein the step of depositing the alloy layer is performed in a first chamber at a temperature ranging from about room temperature to less than about 300 degrees centigrade.

5. The method of claim 1 wherein the step of depositing the layer of aluminum is performed in a second chamber at a temperature ranging from about room temperature to less than about 200 degrees centigrade, followed by increasing the temperature of the wafer to greater than 200 degrees centigrade.

6. The method of claim 5 wherein the temperature of the wafer is increased to a range between about 400 degrees centigrade to about 600 degrees centigrade.

7. The method of claim 1 wherein the step of depositing the layer of aluminum is performed at a temperature greater than about 200 degrees centigrade.

8. The method of claim 7 wherein the step of depositing the layer of aluminum is performed at a temperature ranging from about 400 degrees centigrade to about 600 degrees centigrade.

9. A method of simultaneously metallizing a portion of a surface of a semiconductor material that is exposed through a contact hole and filling the contact-hole, comprising the steps in the order listed of:
   providing a semiconductor wafer;

forming an insulating layer over the semiconductor wafer;

forming a contact-hole through the insulating layer;

in a first chamber, depositing on the surface of the semiconductor material a layer of alloy including aluminum and a refractory metal, the layer of alloy being deposited in a single step and from a single target formed of both the aluminum and the refractory metal, the deposition being continued for a time period such that only a portion of the contact-hole is filled with the layer of alloy; and in a second chamber, depositing a layer of aluminum over the layer of alloy including the layer of alloy present in the hole substantially filling the contact-hole thereby.

10. The method of claim 9 wherein the aluminum is an aluminum alloy.

11. The method of claim 9 wherein the refractory metal is selected from the group consisting of titanium, tungsten, a composite thereof, and titanium nitride.

12. The method of claim 9 wherein the step of depositing the alloy layer is performed at a temperature ranging from about room temperature to less than about 200 degrees centigrade.

13. The method of claim 9 wherein the step of depositing the layer of aluminum is performed at a temperature ranging from about room temperature to less than about 200 degrees centigrade, followed by increasing the temperature in the second chamber to greater than 200 degrees centigrade.

14. The method of claim 13 wherein the temperature in the second chamber is increased to range from about 400 degrees centigrade to about 600 degrees centigrade.

15. The method of claim 9 wherein the step of depositing the layer of aluminum is performed at a temperature greater than about 200 degrees centigrade.

16. The method of claim 15 wherein the step of depositing the layer of aluminum is performed at a temperature ranging from about 400 degrees centigrade to about 600 degrees centigrade.

17. The method of claim 1 further comprising the step of forming a barrier layer between the step of forming a contact-hole and the step of depositing the layer of alloy.

18. The method of claim 9 further comprising the step of forming a barrier layer between the step of forming a contact-hole and the step of depositing on the surface of the semiconductor material the layer of alloy.

* * * * *